(12) United States Patent
Abraham et al.

(10) Patent No.: US 8,754,491 B2
(45) Date of Patent: Jun. 17, 2014

(54) SPIN TORQUE MRAM USING BIDIRECTIONAL MAGNONIC WRITING

(75) Inventors: David W. Abraham, Croton, NY (US); Niladri N. Mojumder, Lafayette, IN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/100,043

(22) Filed: May 3, 2011

(65) Prior Publication Data
US 2012/0280338 A1    Nov. 8, 2012

(51) Int. Cl.
   *H01L 29/82*      (2006.01)
   *H01L 21/8239*    (2006.01)

(52) U.S. Cl.
   USPC ...... 257/421; 257/E21.002; 438/55; 365/158; 365/175; 365/171

(58) Field of Classification Search
   USPC ............. 257/E21.002; 438/55; 365/158, 175, 365/171
   See application file for complete search history.

(56) References Cited

U.S. PATENT DOCUMENTS

| | | | |
|---|---|---|---|
| 5,640,343 A | 6/1997 | Gallagher et al. | |
| 5,966,012 A | 10/1999 | Parkin | |
| 6,259,586 B1 | 7/2001 | Gill | |
| 6,300,150 B1 | 10/2001 | Venkatasubramanian | |
| 6,545,896 B1 | 4/2003 | Munden et al. | |
| 6,599,098 B2 * | 7/2003 | Weng et al. | 417/207 |
| 6,650,513 B2 | 11/2003 | Fullerton et al. | |
| 6,724,674 B2 | 4/2004 | Abraham et al. | |
| 6,759,263 B2 * | 7/2004 | Ying et al. | 438/48 |
| 6,771,534 B2 | 8/2004 | Stipe | |
| 6,809,900 B2 | 10/2004 | Covington | |
| 6,819,586 B1 | 11/2004 | Anthony et al. | |
| 6,836,392 B2 | 12/2004 | Carey et al. | |
| 6,950,260 B2 | 9/2005 | Coffey et al. | |
| 6,977,838 B1 | 12/2005 | Tsang et al. | |
| 6,985,383 B2 | 1/2006 | Tang et al. | |
| 7,035,137 B2 | 4/2006 | Iwata et al. | |
| 7,154,771 B2 | 12/2006 | Braun | |
| 7,164,077 B2 * | 1/2007 | Venkatasubramanian | 136/203 |
| 7,372,116 B2 | 5/2008 | Fullerton et al. | |
| 7,411,815 B2 * | 8/2008 | Gogl | 365/158 |
| 7,486,545 B2 | 2/2009 | Min et al. | |

(Continued)

OTHER PUBLICATIONS

International Search Report; International Application No. PCT/US2012/029881; International Filing Date: Mar. 21, 2012; Date of Mailing: Jun. 8, 2012; 5 pages.

(Continued)

*Primary Examiner* — Lex Malsawma
*Assistant Examiner* — Sheng Zhu
(74) *Attorney, Agent, or Firm* — Cantor Colburn LLP; Vazken Alexanian

(57) ABSTRACT

An apparatus is provided for bidirectional writing. A stack includes a reference layer on a tunnel barrier, the tunnel barrier on a free layer, and the free layer on a metal spacer. The apparatus includes an insulating magnet. A Peltier material is thermally coupled to the insulating magnet and the stack. When the Peltier/insulating magnet interface is cooled, the insulating magnet is configured to transfer a spin torque to rotate a magnetization of the free layer in a first direction. When the Peltier/insulating magnet interface is heated, the insulating magnet is configured to transfer the spin torque to rotate the magnetization of the free layer in a second direction.

8 Claims, 12 Drawing Sheets

(56) References Cited

U.S. PATENT DOCUMENTS

| | | | |
|---|---|---|---|
| 7,556,869 B2* | 7/2009 | Fukushima et al. | 428/816 |
| 7,593,278 B2 | 9/2009 | Hu et al. | |
| 7,602,000 B2 | 10/2009 | Sun et al. | |
| 7,606,065 B2 | 10/2009 | Fontana et al. | |
| 7,796,428 B2 | 9/2010 | Redon | |
| 8,054,677 B2 | 11/2011 | Zhu | |
| 8,089,132 B2 | 1/2012 | Zheng et al. | |
| 8,199,564 B2 | 6/2012 | Zheng et al. | |
| 8,217,478 B2 | 7/2012 | Lou et al. | |
| 8,223,532 B2 | 7/2012 | Wang et al. | |
| 2002/0121094 A1* | 9/2002 | VanHoudt | 62/3.3 |
| 2005/0117392 A1* | 6/2005 | Hayakawa et al. | 365/171 |
| 2005/0167770 A1 | 8/2005 | Fukuzawa et al. | |
| 2006/0013039 A1 | 1/2006 | Braun et al. | |
| 2009/0051880 A1 | 2/2009 | Ito | |
| 2009/0052222 A1 | 2/2009 | Hu et al. | |
| 2009/0161422 A1 | 6/2009 | Zhu et al. | |
| 2009/0175110 A1 | 7/2009 | Zayets et al. | |
| 2010/0080047 A1* | 4/2010 | Liu et al. | 365/157 |
| 2010/0091563 A1* | 4/2010 | Zheng et al. | 365/171 |
| 2010/0110783 A1 | 5/2010 | Liu et al. | |
| 2010/0148167 A1 | 6/2010 | Whig et al. | |
| 2010/0208516 A1 | 8/2010 | Javerliac et al. | |
| 2010/0271870 A1 | 10/2010 | Zheng et al. | |
| 2011/0063758 A1 | 3/2011 | Wang et al. | |
| 2011/0146741 A1* | 6/2011 | Hida et al. | 136/205 |

OTHER PUBLICATIONS

Written Opinion of the International Searching Authority; International Application No. PCT/US2012/029881; International Filing Date: Mar. 21, 2012; Date of Mailing: Jun. 8, 2012; 9 pages.

Fukushima, et al., "Peltier Effect in Sub-Micron-Size Metallic Junctions", Jpn. J. Appl. Phys., vol. 44, 2005, pp. L12-L14.

Lee, et al., "Increase of Temperature Due to Joule Heating During Current-Induced Magnetization Switching of an MgO-Based Magnetic Tunnel Junction", Appl. Phys. Lett., vol. 92, 2008, 233502.

Li, et al., "Characterization of Sputtered Barium Ferrite Thin Films on Silicon-Nitride-Coated Carbon Substrates", Materials Research Society Symposium Proceedings, vol. 341, 1994, pp. 59-64.

Ohta, et al., "Giant Thermoelectric Seeback Coefficient of a Two-Dimensional Electron Gas in $SrTiO_3$", Nature Materials, vol. 6, 2007. pp. 129-134.

Slonczewski, et al., "Initiation of Spin-Transfer Torque by Thermal Transport from Magnons", Physical Review B, vol. 82, Issue 5, 2010, 054403; pp. 054403-1-11.

Sugihara, et al., "Giant Peltier Effect in a Submicron-Sized Cu—Ni/Au Junction with Nanometer-Scale Phase Separation", Appl. Phys. Express, vol. 3, 2010, 065204.

Sui, et al., "Barium Ferrite Thin-Film Recording Media", Journal of Magnetism and Magnetic Materials, vol. 155, Issues 1-3, Mar. 2, 1996, pp. 132-139.

Zhang, et al., "Thermoelectric Performance of Silicon Nanowires", Appl. Phys. Lett., vol. 94, 2009, 213108.

International Search Report; International Application No. PCT/US12/31938; International Filing Date: Apr. 3, 2012; Date of Mailing: Jun. 22, 2012; 5 pages.

Written Opinion of the International Searching Authority; International Application No. PCT/US12/31938; International Filing Date: Apr. 3, 2012; Date of Mailing: Jun. 22, 2012; 6 pages.

* cited by examiner

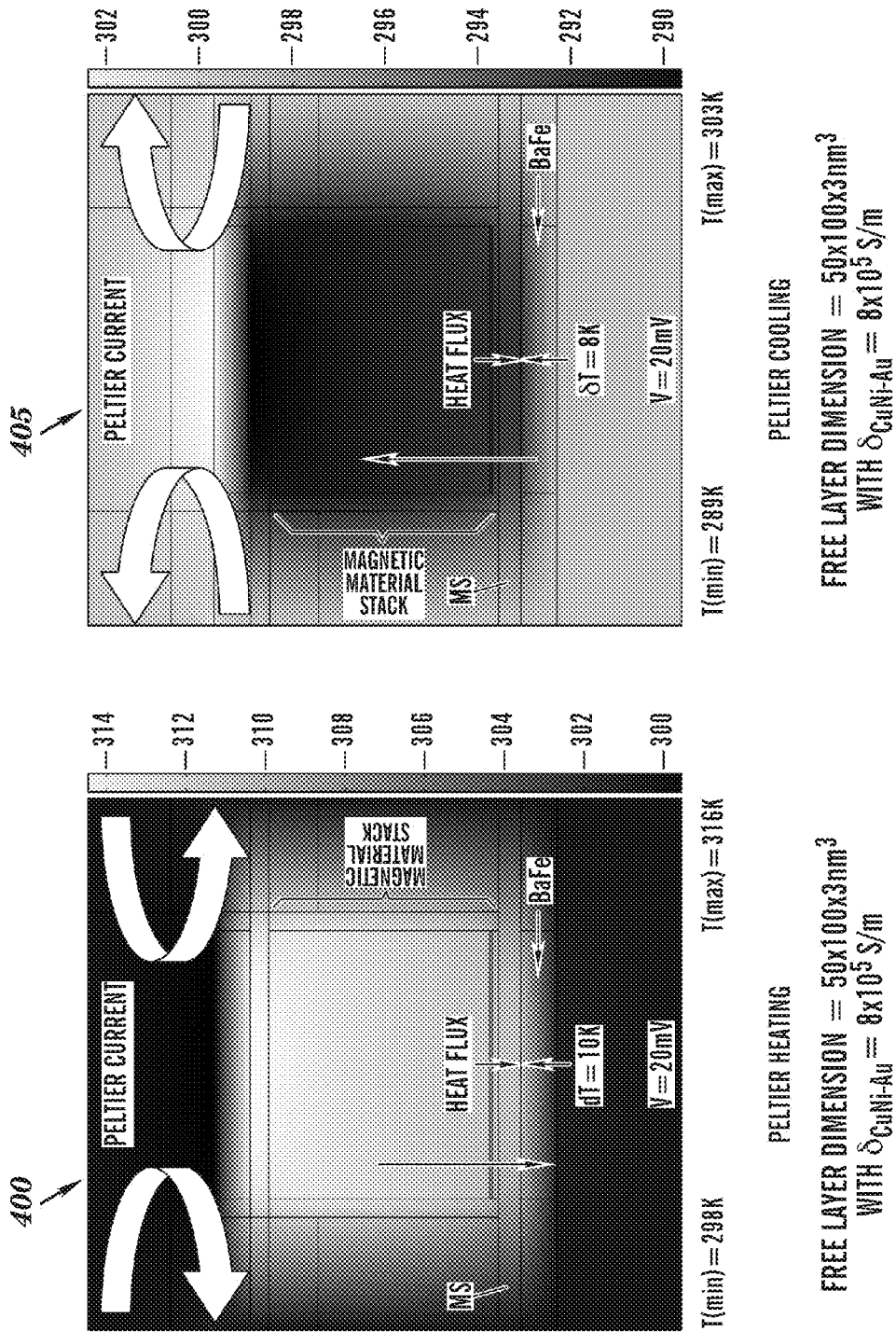

SPIN TORQUE MRAM USING BIDIRECTIONAL MAGNONIC WRITING

BACKGROUND

Exemplary embodiments relate to memory, and more specifically, to bidirectional writing in memory.

Magnetoresistive random access memory (MRAM) is a non-volatile computer memory (NVRAM) technology. Unlike conventional RAM chip technologies, in MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction and is the simplest structure for a MRAM bit. A memory device is built from a grid of such "cells".

One method of reading is accomplished by measuring the electrical resistance of the cell. A particular cell is (typically) selected by powering an associated transistor which switches current from a supply line through the cell to ground. Due to the magnetic tunnel effect, the electrical resistance of the cell changes due to the orientation of the magnetization in the two plates. By measuring the resistance of any particular cell, the direction of magnetization of the writable plate can be determined. One may, for the sake of consistency in discussions below, define the two plates having the same magnetization direction as representing a logic "1", while if the two plates are of opposite magnetization the resistance will be higher, thus representing logic "0".

BRIEF SUMMARY

According to an exemplary embodiment, a magnetoresistive random access memory (MRAM) device is provided. A magnetic stack includes a reference layer adjacent to a tunnel barrier, the tunnel barrier adjacent to a free layer, and the free layer adjacent to a metal spacer. An insulating magnet is disposed between the magnetic stack and a Peltier material. The Peltier material is thermally coupled to the insulating magnet and the magnetic stack. Cooling an interface between the Peltier material and the insulating magnet causes the insulating magnet to transfer a spin torque to rotate a magnetization of the free layer in a first direction. Heating the interface between the Peltier material and the insulating magnet causes the insulating magnet to transfer the spin torque to rotate the magnetization of the free layer in a second direction.

According to an exemplary embodiment, a magnetoresistive random access memory (MRAM) device is provided. A magnetic stack includes a reference layer adjacent to a tunnel barrier, the tunnel barrier adjacent to a free layer, and the free layer adjacent to a metal spacer. The MRAM device include an insulating magnet, an n-type Peltier material thermally coupled to the insulating magnet and the magnetic stack, and a p-type Peltier material thermally coupled to the insulating magnet and the magnetic stack. Cooling of an interface between the n-type Peltier material and the insulating magnet and cooling of an interface between the p-type Peltier material and the insulating magnet cause the insulating magnet to transfer a spin torque to rotate a magnetization of the free layer in a first direction. Heating of the interface between the n-type Peltier material and the insulating magnet and heating of the interface between the p-type Peltier material and the insulating magnet cause the insulating magnet to transfer the spin torque to rotate the magnetization of the free layer in a second direction.

According to an exemplary embodiment, A method of forming a magnetoresistive random access memory (MRAM) device is provided. The method includes forming an insulating magnet adjacent to a substrate, forming a metal spacer adjacent to the insulating magnet, where the metal spacer being a third lead, forming a free layer adjacent to the metal spacer, and forming a tunnel barrier adjacent to the free layer. Also, the method includes forming a reference layer adjacent to the tunnel barrier, forming a second lead adjacent to the reference layer, forming a Peltier material adjacent to the second lead, and forming a first lead adjacent to the Peltier material.

According to an exemplary embodiment, a method of forming a magnetoresistive random access memory (MRAM) device is provided The method includes forming an n-type Peltier material adjacent to a first lead, forming a p-type Peltier material adjacent to a fourth lead, and forming a second lead adjacent to both the n-type Peltier material and the p-type Peltier material. Also, the method includes forming an insulating magnet adjacent to the second lead, forming a metal spacer adjacent to the insulating magnet, forming a free layer adjacent to the metal spacer, forming a tunnel barrier adjacent to the free layer, forming a reference layer adjacent to the tunnel barrier, and forming a third lead adjacent to the reference layer.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

FIG. 4A illustrates an example of spatial temperature distribution for bidirectional magnonic switching according to an exemplary embodiment.

FIG. 4B illustrates an example of spatial temperature distribution for bidirectional magnonic switching according to an exemplary embodiment.

DETAILED DESCRIPTION

The magnetic field required to write a small magnetic bit increases with the reduction of the bit size. Magnetic storage technologies in either hard-disk drive (HDD) or magnetic random access memory (MRAM) are pushing against physical limits for magnetic fields available to write a magnetic bit with ever-diminishing size. Spin torque provides an alternative to magnetic field induced writes. State of the art spin torque-based writes depend on a charge current to generate the said spin current for write-operation. The use of spin current avoids the limitations of magnetic field-based writes, extending the scaling prospects of memory bits.

Recently, state of the art theoretical work has proposed a new physical mechanism for generating spin currents, using thermally generated magnon currents, which are converted to spin current at an appropriate interface. However, in a practical device, bidirectional switching would require bidirectional heat flow (e.g., two separate heat sources). In an implementation using a heater attached to the device, which in turn is attached to a thermal sink, the heat flow would be unidirectional. Arrangements with heaters on either side of the device (with heat sinks as well to generate sufficient temperature gradients) may cause issues, since this would require large amounts power.

In exemplary embodiments, a magnetic device such as an MRAM device is proposed, which uses a bidirectional heat flow write scheme, and which does not require a second electrical current pulse to the device (and does not require a heat on either side of the device). The bi-directionality is achieved by building in a Peltier device adjacent to the magnetic device according to exemplary embodiments. The resulting structure is a three-terminal device (or device with three leads), achieving both read and write capabilities. The benefits of this device include, but are not limited to, having power requirements that are significantly reduced over standard spin torque MRAM requirements, and the separation of the read and write functions which results in a less constrained design for the magnetic stack. Moreover, the stochastic spread in switching delay originating from random thermal fluctuations can be squeezed down significantly due to magnonic torque overdrive (e.g., by tilting the magnetic anisotropy of the insulating magnet). Also, this device broadens the choice of resistance area (RA) product of the tunnel barrier in the magnetic junction by eliminating the requirement of high electrical current density flowing through the actual storage element (e.g., the free layer) during write because no electrical current is required to flow through the free layer.

Figure 1:
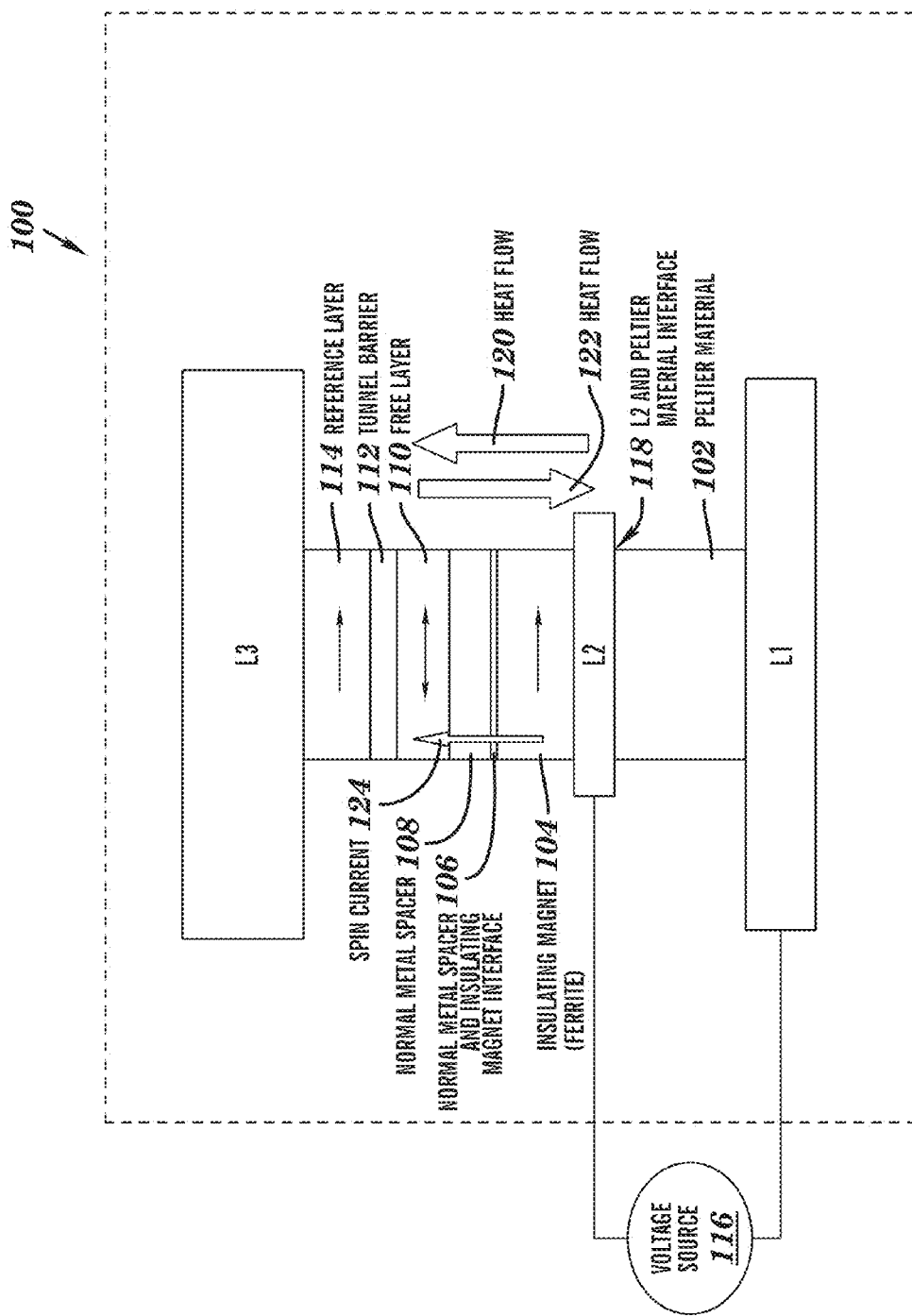
FIG. 1 is a cross-sectional view of an MRAM device according to an exemplary embodiment.

Now turning to FIG. 1, there is shown a cross-sectional view of an MRAM device 100 according to an exemplary embodiment. FIG. 1 shows a single-stage Peltier design.

The design for the device 100 includes Peltier material 102 formed on a lead L1. A lead L2 is formed on top of the Peltier material 102. An insulating magnet 104 (e.g., made of ferrite) is formed on the lead L2. The insulating magnet 104 has a pinned magnetization direction which is shown as a right direction in this example, but it is understood that the fixed magnetization direction may be chosen to be a left magnetization. A normal metal spacer 108 is formed on the insulating magnet 104. A normal metal spacer and insulating (ferrite) magnet interface 106 is between the normal metal spacer 108 and the insulating magnet 104. A free layer 110 is formed on top of the normal metal spacer 108. The free layer 110 is shown with arrows pointing in both the left and right directions, which indicate that the magnetization of the free layer 110 can be switched between a left magnetization and a right magnetization depending on the operation of the device 100. A tunnel barrier 112 can be formed on top of the free layer 110, and a reference layer 114 can be formed on top of the tunnel barrier 112. The reference layer 114 is a magnet shown with a pinned (i.e., fixed) magnetization to the right direction in this example, but it is understood that the reference layer 114 may have a left magnetization in another case. A lead L3 is formed on top of the reference layer 114. The leads L1, L2, and L3 are made of metal and may be considered metal wires.

A voltage source 116 is connected to the lead L1 and the lead L2 of the device 100. The voltage source 116 is configured to change (by its polarity) the direction of the current as desired, such that electrical current can flow into lead L1 and out through lead L2 in one case (e.g., for heating the device 100) and the electrical current can flow into lead L2 and out through lead L1 in another case (e.g., for cooling the device 100).

For example, the electrical current from the voltage source 116 is applied between leads L1 and L2, and depending on the direction of the current, the temperature at the L2/Peltier material interface 118 rises or drops. The dimensions and thermal properties of the leads L1, L2, and L3 are chosen so that heat flows between leads L2 and L3. To this end, the dimension of lead L2 should be chosen as small as possible (i.e., thin) so that heat does not flow along the length of the wire which is the lead L2. The length of lead L2 is from left to right in FIG. 1. At the same time, the cross-sectional dimensions of the lead L2 should be large enough so that Joule heating in the wire is not dominant. Additionally, the leads L1 and L3 should be good thermal sinks, with high thermal conductivity and of sufficient dimension so that under operation the temperature drop in the vicinity of these wires (leads L1 and L3) is small compared to the temperature drop across the active stack (which includes the insulating (ferrite) magnet 104, the normal metal/insulating magnet interface 106, the normal metal spacer 108, the free layer 110, the tunnel barrier 112, and the reference layer 114).

The Peltier material 102 and the metal in the lead L2 should have the property of high temperature endurance (e.g., such as a higher melting point>1200 C). This helps the high temperature growth of the insulating magnet 104 (e.g., the magnetic insulator which is a ferrite film) on top of the Peltier stack (which is the lead L1, the Peltier material 102, and the lead L2). Thin films formed from a material such as, for example, niobium (Nb) doped strontium titanate ($SrTiO_3$) (with a melting point approximately ~2100 C) with excellent thermoelectric properties may be utilized as the Peltier material 102. Tungsten (with a melting point ~3500 C) may be utilized as (electrode) lead L2. TaN, TiN, and molybdenum can also be utilized as lead L2 materials.

The insulating magnet 104 is a non-conducting magnetic material such as a ferrite. The normal metal spacer 108 is a thin non-magnetic metal. The magnetic stack consists of the free layer 110, the tunnel barrier 112, and the reference layer 114. The free layer 110 may be a thin ferromagnetic film (e.g. $Co_{40}Fe_{40}B_{20}$, $Ni_{80}Fe_{20}$, and/or any of a variety of other materials) and may have a thickness, e.g., in the range of about 0.5 nm-5.0 nm (nanometers). The tunnel barrier 112 may be chosen to provide a large magnetoresistance, and may be AlO, MgO, and/or similar materials. The thickness of the free layer 110 can be chosen to provide a resistance-area (RA) product in a convenient range, e.g., 1-100 ohm-micron$^2$. The reference layer 114 provides a magnetization adjacent to the tunnel barrier 112 which does not change magnetization orientation (which is shown as a right magnetization) under the conditions which cause the free layer 110 to rotate. Various materials of the reference layer 114 can be used for this purpose and can include elements such as a synthetic antiferromagnet, a pinning antiferromagnet, and so forth. The orientation of the magnetization of the insulating (ferrite) magnet 104, the free layer 110, and the reference layer 114 can be in-plane (left or right) and/or out-of-plane (e.g., perpendicular such as up or down which is not shown in this example but understood by one skilled in the art according to the present disclosure). The above descriptions of materials (referencing FIG. 1) for leads L1, L2, L3, Peltier material, insulating magnet, free layer, tunnel barrier, and reference layer may also apply to FIGS. 2 and 3.

In order to write the free layer 110, an electrical current is applied by the voltage source 116 between leads L1 and L2 which causes the temperature at the lead L2 (i.e., the lead L2 and Peltier material interface 118) to rise or fall depending on the direction of the electrical current flow (and the lead L1 has an opposite temperature change). A positive or negative temperature gradient across the insulating (ferrite) magnet/normal metal interface 106 originates a heat flux towards or away from the insulating magnet 104 (magnetic insulator) respectively. This heat flux will cause a magnonic spin current from the insulating magnet 104 to be injected into the normal metal spacer 108 that flows to the free layer 110 and in turn leads to the fast (magnetization) switching of the free layer 110. For example, a temperature rise of 4-10K (Kelvin) (at the free layer 110) would be sufficient to switch the typical free layer 110 from one magnetization direction (e.g., left) to a different magnetization direction (e.g., right), and 0.5 mA-1 mA of electrical current through the Peltier material 102 could be applied by the voltage source 116 to achieve this switch (e.g., for a 70 width×150 height nm pillar of Peltier material 102). Reversal of the Peltier current applied by the voltage source 116 (i.e., reversal of the polarity) would cause the magnetization of the free layer 110 to orient opposite (e.g., antiparallel) to the direction of magnetization of the (ferrite) insulating magnet 104 layer, thereby achieving bipolar writing capability.

Suppose electrical current applied by the voltage source 116 flows into lead L2 (i.e., the positive side of the voltage source 116 is connected to lead L2 and the negative side is connected to lead L1). This will cause the temperature to rise at the lead L2 and the Peltier material interface 118, while the temperature drops at the L1 and Peltier material interface. Accordingly, a heat flow 120 (i.e., heat flux) shown as an up arrow is generated by the electrical current flowing in the lead L2, through the Peltier material 102, and then out through the lead L1. As a result of the heat flow 120, magnons are generated in the insulating magnet 104 to produce spin current 124 that has angular momentum (i.e., spin torque) according to the magnetization of the insulating magnet 104. Since the heat flow 120 is flowing up, the spin current 124 enters the free layer 110 and causes the magnetization of the free layer 110 to have a right magnetization (orientation) which is parallel to the right magnetization of the insulating magnet 104.

Suppose electrical current applied by the voltage source 116 flows into lead L1 (i.e., the positive side of the voltage source 116 is connected to lead L1 and the negative side is connected to lead L2). This will cause the temperature to drop/cool at the lead L2 and the Peltier material interface 118, while the temperature rises at the interface of the lead L1 and Peltier material 102. Accordingly, a heat flow 122 shown as a down arrow is generated by the electrical current flowing into the lead L1, through the Peltier material 102, and then out through the lead L2. As a result of the heat flow 122, magnons are generated in the insulating magnet 104 to produce the spin current 124 that has angular momentum according to the magnetization of the insulating magnet 104. Since the heat flow 121 is flowing down in this case, the spin current 124 enters the free layer 110 and causes the magnetization of the free layer 110 to have a left magnetization (orientation) which is antiparallel to the right magnetization of the insulating magnet 104.

A bipolar electric potential (via the voltage source 116) between leads L1 and L2 sends a current (say $I_P$) through the Peltier material 102. A positive potential (via the voltage source 116) at lead L2 relative to lead L1 heats up the lead L2 (i.e., metal strap), converting lead L2 to a heat source while the lead L3 acts as a heat sink. Likewise, a negative potential at lead L2 relative to lead L2 cools down lead L2, transforming lead L2 into a heat sink while the lead L3 acts as a heat source. Changing the polarity of the applied voltage (applied by the voltage source 116) between lead L1 and lead L2 thus develops a bi-directional heat flux (dQ/dt) (shown as heat flows 120 and 122) flowing normally across the metal (L2)-ferrite interface, which is the interface between lead L2 and the insulating magnet 104. This creates a bipolar magnonic current (i.e., spin current 124) utilized for bi-directional magnetic switching.

Accordingly, the direction of the flow of electrical current (from the voltage source 116) into lead L1 and/or into lead L2 causes the interface of lead L2 and the Peltier material 102 to either cool down or heat up, respectively. This allows for bidirectional writing (writing left or right magnetization for in-plane, or writing up or down magnetization for out of plane) of the free layer 110. The angular momentum of the spin current 124 writes a right magnetization in the free layer 110 for the up heat flow 120, and the angular momentum of the spin current 124 writes a left magnetization in the free layer 110 for the down heat flow 122, which implements bidirectional writing without having to provide, e.g., two separate heat sources at opposing ends of the device 100.

Further, the device 100 state read-out can be achieved by measuring the resistance between leads L2 and L3. The elimination of high electrical current densities flowing perpendicular to the magnetic stack (i.e., through the free layer 110, the tunnel barrier 112, and the reference layer 114) significantly relaxes the choice of resistance area (RA) product for the tunnel barrier 112 of the device 100 which is a storage device. A relatively thicker MgO (higher RA) for the tunnel barrier 112 can eliminate the requirement of a lower supply voltage during the read of magnetization of the free layer 110. On the other hand, a lower RA product for the tunnel barrier 112 can ensure faster cell read through voltage sensing. It is understood that the device 100 can be considered as cell in a magnetic storage device. Numerous individual devices 100 can be connected in an array as a plurality of cells for the magnetic storage device in which one magnetization orientation of the free layer 110 corresponds to a 1 (e.g., right magnetization) and the opposite magnetization orientation (e.g., left magnetization) corresponds to a 0 (and/or vice versa) as understood by one skilled in the art.

The process of the spin current (such as the spin current 124) carrying and transferring the angular momentum (corresponding to the magnetization) of the insulating magnet (such as the insulating magnet 104) to flip the magnetization of the free layer (such as the free layer 110) is called spin torque transfer (STT). The angular momentum of the insulating magnet 104 is its spin torque. The Peltier material (such as the Peltier material 102) is used to take advantage of the Peltier effect. An example of the Peltier effect is provided for background purposes of the reader but exemplary embodiments are not limited to the exact details or materials used in the example below. In the Peltier effect, there is a cooling of one junction/interface with the Peltier material and a heating of the other junction/interface with the Peltier material when electric current is maintained in a circuit of material consisting of two dissimilar conductors; the effect is even stronger in circuits containing dissimilar semiconductors. For example, in a circuit consisting of a battery joined by two pieces of, e.g., copper wire to a length of Peltier material (e.g., bismuth), a temperature rise occurs at the junction where the current passes from copper to Peltier material, and a temperature drop occurs at the junction where the current passes from Peltier material to copper.

Figure 2:
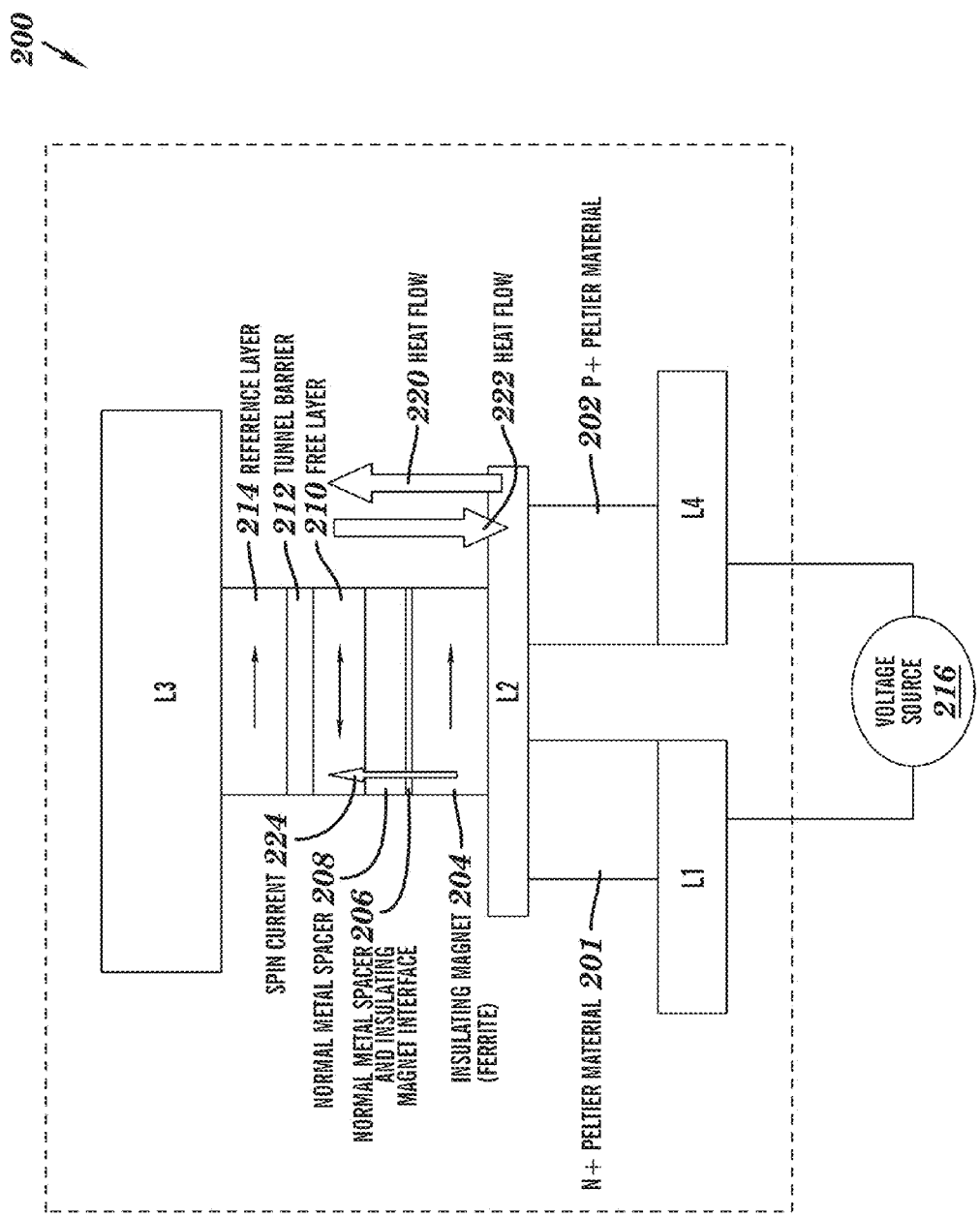
FIG. 2 is a cross-sectional view of an MRAM device according to another exemplary embodiment.

Now turning to FIG. 2, there is shown a cross-sectional view of an MRAM device 200 according to another exemplary embodiment. The device 200 is a second implementation of exemplary embodiments and operates similarly as discussed above for FIG. 1. For example, the design for the device 200 includes elements 204-214 which correspond to elements 104-114 in FIG. 1. The device 200 includes an insulating magnet 204 (e.g., made of ferrite) that is formed on a lead L2. The insulating magnet 104 has a pinned magnetization direction which is shown as a right direction in this example, but it is understood that the magnetization of the magnetization direction may be chosen to be a left magnetization. A normal metal spacer 208 is formed on the insulating magnet 204. A normal metal spacer and insulating (ferrite) magnet interface 206 is between the normal metal spacer 208 and the insulating magnet 204. A free layer 210 is formed on top of the normal metal spacer 208. The free layer 210 is shown with arrows pointing in both the left and right direction, which indicates that the magnetization of the free layer 210 can switch between a left magnetization and a right magnetization depending on the operation of the device 200. A tunnel barrier 212 can be formed on top of the free layer 210, and a reference layer 214 can be formed on top of the tunnel barrier 212. The reference layer 214 is a magnet shown with a pinned (i.e., fixed) magnetization to the right direction in this example, but it is understood that the reference layer 214 may have a left magnetization in another scenario. A lead L3 is formed on top of the reference layer 214. The leads L1, L2, and L3 are made of metal and may considered metal wires.

In the design in FIG. 2, the lead L2 may also be referred to as the central strap L2, and the lead L2 connects two Peltier materials 201 and 202: one of the arms is n-type Peltier material 201 and the other is p-type Peltier material 202 to ensure an enhanced Peltier coefficient. In this case, the electrical current (i.e., Peltier current) applied by a voltage source 216 flows between leads L1 and L4 (again bi-directionally) to either heat or cool the lead L2 (i.e., the interface between the L2 and the n-type Peltier material 201 and the interface between the lead L2 and the p-type Peltier material 202) based on the polarity of the voltage source 216. The lead L2 is electrically connected to the Peltier materials 201 and 202 but is not otherwise connected to the rest of the circuitry.

For example, in order to write the free layer 210, suppose that electrical current applied by the voltage source 216 flows into lead L1 (i.e., the positive side of the voltage source 216 is connected to lead L1 and the negative side (or ground) is connected to lead L4) and flows out of lead L4. This will cause the temperature to drop/cool at the interface of the lead L2 and the n-type Peltier material 201 and to drop/cool at the interface of lead L2 and the p-type Peltier material 202. Accordingly, a heat flow 222 (e.g., heat flux) shown as a down arrow is generated by the electrical current flowing in the lead L1, through the n-type Peltier material 201, through the lead L2, through the p-type Peltier material 202, and then out through the lead L4. As a result of the heat flow 222 flowing from the lead L3 (down through the insulating magnet 204), magnons are excited/generated in the insulating magnet 204 to produce spin current 224 that has angular momentum (i.e., spin torque) according to the magnetization of the insulating magnet 204. Since the heat flow 222 is flowing down, the spin current 224 (carrying the spin torque) enters the free layer 210 and causes the magnetization of the free layer 210 to have a left magnetization (orientation) which is antiparallel to the right magnetization of the insulating magnet 204. In this case, the lead L3 acts as a heat source, and the lead L2 acts as a heat sink. The lead L3 is designed to be thermally (and/or physically) large enough to not be affected by the cooling (or heating) of the interface between the lead L2 and Peltier materials 201 and 202; the lead L3 may be considered as a thermal reservoir.

Now, suppose that electrical current applied by the voltage source 216 flows into lead L4 (i.e., the positive side of the voltage source 216 is connected to lead L4 and the negative side (or ground) is connected to lead L1) and flows out of lead L1. This will cause the temperature to rise/heat up at the interface of lead L2 and the n-type Peltier material 201 and rise/heat up at the interface of the p-type material 202. Accordingly, a heat flow 220 shown as an up arrow is generated by the electrical current flowing in the lead L4, through the p-type Peltier material 202, through the lead L2, through the n-type Peltier material 201, and then out through the lead L1. As a result of the heat flow 220 flowing upward out through the insulating magnet 204, magnons are excited/generated in the insulating magnet 204 to produce spin current 224 that has angular momentum (i.e., spin torque) according to the magnetization of the insulating magnet 204. Since the heat flow 220 is flowing up this case, the spin current 224 enters the free layer 210 and causes the magnetization of the free layer 210 to have a right magnetization (orientation) which is parallel to the right magnetization of the insulating magnet 204. In this case, the lead L3 acts as a heat sink, and the lead L2 acts as a heat source. Again, the L3 is designed to be thermally (and/or physically) large enough to not be affected by the cooling or heating of the interface between the lead L2 and Peltier materials 201 and 202.

Accordingly, in the device 200, the direction of the flow of electrical current (from the voltage source 216) into lead L1 and/or into lead L4 causes the interface of lead L2 and the Peltier material 201 and 202 to either cool down or heat up, respectively. This allows for bidirectional writing (writing left or right magnetization for in-plane, or writing up or down magnetization for out-of-plane) of the free layer 210. The angular momentum (i.e. the spin torque) of the spin current 224 writes a right magnetization in the free layer 110 for the up heat flow 220, and the angular momentum of the spin current 224 writes a left magnetization in the free layer 210 for the down heat flow 222, which implements bidirectional writing without having to provide, e.g., two separate heat sources at opposing ends of the device 200.

Reading (e.g., a 1 or 0 in the free layer 210) the device 200 is accomplished by measuring the resistance between L3 and either L1 or L4, in which one resistance corresponds to a left magnetization and another corresponds to a right magnetization for the free layer 210. Care can be taken to use currents when measuring the resistance (between L3 and either L1 or L4) that are small enough to not cause temperature changes at the lead L2 (strap) during reading. Reading the device 200 without causing temperature changes at the lead L2 can be accomplished in exemplary embodiments by using low currents and/or by using (applying) equal currents in the n-type and p-type Peltier materials 201 and 202 (i.e., splitting the electrical current between leads L1 and L4). One benefit of this implementation is that the thermal conductivity of the lead L2 is not an issue, and the lead L2 (i.e., metal strap) can be made thick (from top to bottom) without compromising performance by diverting heat flow away from the insulating (ferrite) magnet 204/normal metal spacer 208/free layer 210/tunnel barrier 212/reference layer 114 stack structure. In accordance with exemplary embodiments, the choice of the dual Peltier structure (arms of n-type and p-type Peltier material 201 and 202) relaxes the constraints on dimension and thermal properties of the lead L2 (metal strap) connected to the insulating (ferrite) magnet 204 since heat is not drawn away from the Peltier materials 201 and 202 and/or from magnetic materials (e.g., insulating magnet 104, free layer 210, and reference layer 214) through the lead L2 (metal strap) and since the lead L2 is not connected to the rest of the circuitry. Additionally dual Peltier materials 201 and 202 increase the efficiency of heating and cooling. This geometry shown in FIG. 2 may be considered as having an additional benefit over that shown in FIG. 1. Here, even making lead L2 very thick will not provide an additional heat path out of the device 200 (which could hinder the heat flow 220 or 222); while for the device 100 in FIG. 1, making lead L2 thicker in order to easily carry electrical current to power the Peltier structure (e.g., comprising lead L1, lead L2, and Peltier material 102) may also thermally short out the device 100, thus minimizing the heat flow available to flow through the insulating magnet 104.

Figure 3:
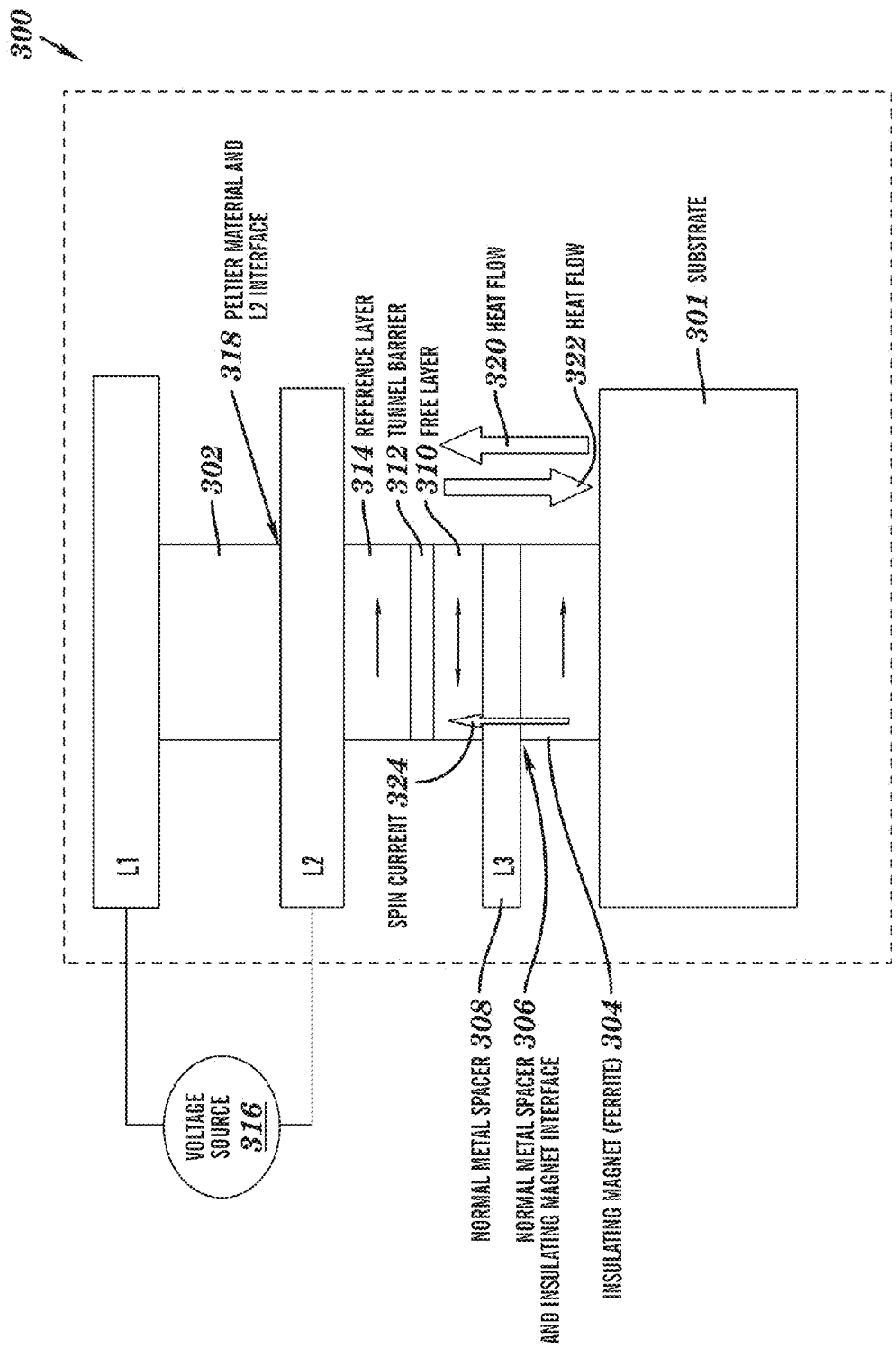
FIG. 3 is a cross-sectional view of an MRAM device according to another exemplary embodiment.

With reference to FIG. 3, there is shown a cross-sectional view of an MRAM device 300 according to another exemplary embodiment. The device 300 is a third implementation of exemplary embodiments and operates similarly as discussed above for FIGS. 2 and 3. For example, the design for the device 300 includes elements 304-314 which correspond to elements 104-114 in FIG. 1.

Unlike FIGS. 1 and 2, the third configuration with the device 300 shows a Peltier stack (of lead L1, Peltier material 302, and lead L2) for heating and/or cooling on top of a reference layer 314 (i.e., fixed layer or pinned layer). An insulating (ferrite) magnet 304 can be grown first on a substrate 301 (such as, e.g., amorphous carbon with SiN coating) and then the other subsequent layers can be grown vertically as seen in FIG. 3. Lead L3 is a normal metal spacer 308 in the device 300, and the lead L3 is formed on top of the insulating magnet 304. A normal metal spacer and insulating magnet interface 306 is the interface between the normal metal spacer 308 and insulating magnet 304 (ferrite). A free layer 310 is formed on top of the normal metal spacer 308, and a tunnel barrier 312 is formed on the free layer 310. The reference layer 314 is formed on the tunnel barrier 312. The lead L2 is formed on the reference layer 314, and the Peltier material 302 is formed on top of the lead L2. The lead L1 is formed on top of the Peltier material 302.

During a write of the free layer 310, a directional electrical current (via voltage source 316) is sent through the Peltier material 302 between leads L1 and L2, and the electrical current eventually heats up (for electrical current flowing into lead L2 and out through lead L1) and/or cools down (for electrical current flowing into lead L1 and out through lead L2) the lead L2/Peltier material interface 318. The heating or cooling process eventually develops a positive temperature gradient (e.g., up heat flow 320) or negative temperature gradient (e.g., down heat flow 322) respectively at the normal metal spacer/insulating magnet (ferrite) interface 306, as required for magnonic switching. As discussed above, reversing the polarity of the voltage applied by the voltage source 315 to the leads L1 and L2 allows for bidirectional switching of the magnetization for the free layer 310.

The dimensions and thermal properties of the leads L1, L2 and L3 should be chosen so that heat flows between leads L2 and L3. To this end, the dimension of lead L2 should be chosen as small as possible (i.e., thin from top to bottom) so that heat does not flow along the length of the lead L2 (wire). At the same time, the lead L2 (wire) should be large enough (i.e., thick) so that Joule heating in lead L2 is not dominant. Leads L1 and L3 should be good thermal sinks This design of the device 300 provides a wider choice of magnetic materials (such as, e.g., the insulating magnet 304, free layer 310, tunnel barrier 312, and reference layer 314) and electrode materials (such as, e.g., metal leads L3, L2, and L1) as the high temperature hard ferrite (which is the insulating magnet 304) is grown first below the magnetic stack (i.e., free layer 310, tunnel barrier 312, and reference layer 314) and Peltier stack (i.e., lead L2, Peltier material 302, and lead L1).

For all three configurations in FIGS. 1, 2 and 3, perpendicular magnetic anisotropy (PMA) which is perpendicular (i.e., an up or down magnetization for the free layer 310) to the plane may be implemented which helps in reducing the threshold temperature difference at the normal metal spacer/insulating (ferrite) magnet interface 106, 206, 306 required for fast magnonic switching. In PMA configurations, the magnonic spin torque (corresponding to the angular momentum) has to overcome a lower magnetic energy barrier (e.g., approximately $\sim 2*\pi*Ms$) (Ms is the saturation magnetization of the storage layer) than that of an in-plane configuration. A substantially lower thermoelectric current (e.g., approximately $\sim 0.1$ mA-0.5 mA) can produce the required temperature difference at the normal metal spacer/insulating (ferrite) magnet interface 106, 206, 306. This is for a 50 (width)×100 (length) nm device 100, 200, 300 and scales with area. The threshold of temperature difference for magnonic switching scales down to approximately 4K-8K (Kelvin).

Higher RA can be used for these devices 100, 200, 300 since no write electrical current flows through the devices 100, 200, 300. This is beneficial because tunnel barrier integrity (of the tunnel barriers 112, 212, 312) is improved and higher effective bit cell tunneling magnetoresistance (TMR) (including transistor impedance) is enabled. A bit cell corresponds to a free layer such as the free layer 110, 210, 310.

In one implementation, the lead L2 may be a thickness (from top to bottom) between 5 to 10 nanometers (nm), and the width of the lead L2 can be the same as the diameter of the magnetic tunnel junction (e.g., approximately $\sim 50$ nm-100 nm). Within this range for the lead L2, joule heating is small enough to suppress the Peltier cooling, and the MRAM device works as expected. Also, the length of lead L2 (which points into the page in the FIGS. 1-3) may be the same as the diameter of the magnetic tunnel junction (e.g., approximately $\sim 50$ nm-100 nm). However, as lead L2 gets connected to the source/drain of one of the access transistors (not shown but understood by one skilled in the art) through metal via and contacts, the lead L2 may be long (e.g., approximately $\sim 100$ nm) in some cases. It is contemplated that various dimensions may be utilized for leads L1, L2, and L3 in accordance with the present disclosure, and exemplary embodiments are not meant to be limited.

FIG. 4A illustrates an example of spatial distribution of temperature under heating in diagram 400 and FIG. 4B illustrates an example of spatial distribution of temperature under cooling in diagram 405 for bidirectional magnonic switching (e.g., single stage Peltier device) in, e.g., the devices 100, 300 according to exemplary embodiments. The devices 100, 300 are MRAM devices for reading and writing a plurality of bits (1's and 0's). To illustrate heating and cooling in FIGS. 4A and 4B, note that a lighter shading represents higher temperatures and dark shading represents lower temperatures.

FIG. 4A illustrates an example of heating the MRAM device by the Peltier material (e.g., Peltier materials 102, 302). The heating causes a heating flux (i.e., heat flow) into the magnetic stack which includes the reference layer, tunnel barrier, free layer, normal metal spacer, and insulating magnet. In this example, when the voltage source (e.g., voltage sources 116, 316) applies 20 mV between leads L1 and L2 of the device 100, 300, there is a 10K (Kelvin) change in temperature across the magnetic stack.

FIG. 4B illustrates an example of cooling the MRAM device by the Peltier material (e.g., Peltier materials 102 and 302). The cooling causes a heating flux (i.e., heat flow) across the magnetic stack which includes the reference layer, tunnel barrier, free layer, normal metal spacer, and insulating magnet. In this example, when the voltage source (e.g., voltage sources 116, 316) applies 20 mV between leads L1 and L2 of the device 100, 200, there is a −8K change in temperature across the magnetic stack. Spatial distribution of temperature under thermo-electric (Peltier) heating and cooling for bi-directional magnonic switching has been shown in FIGS. 4A and 4B respectively. For a Peltier current flowing from lead L1 to lead L2 (with reference to FIG. 3), the heat flows downward (shown by heat flow 322). However, by reversing the direction of Peltier current between lead L1 and lead L2, heat flows upward (shown by heat flow 320). Unlike the state-of-the-art electric current driven MRAM, no electrical current needs to flow through the tunnel barrier 312 in FIG. 3 for magnetic switching. This significantly relaxes the design constraint for the thin tunnel barrier 312. In one implementation, the tunnel barrier 312 can be made thicker to enhance the tunneling magneto-resistance (TMR) and reduce read disturb (destructive reading) induced parametric failures.

Figure 5A:
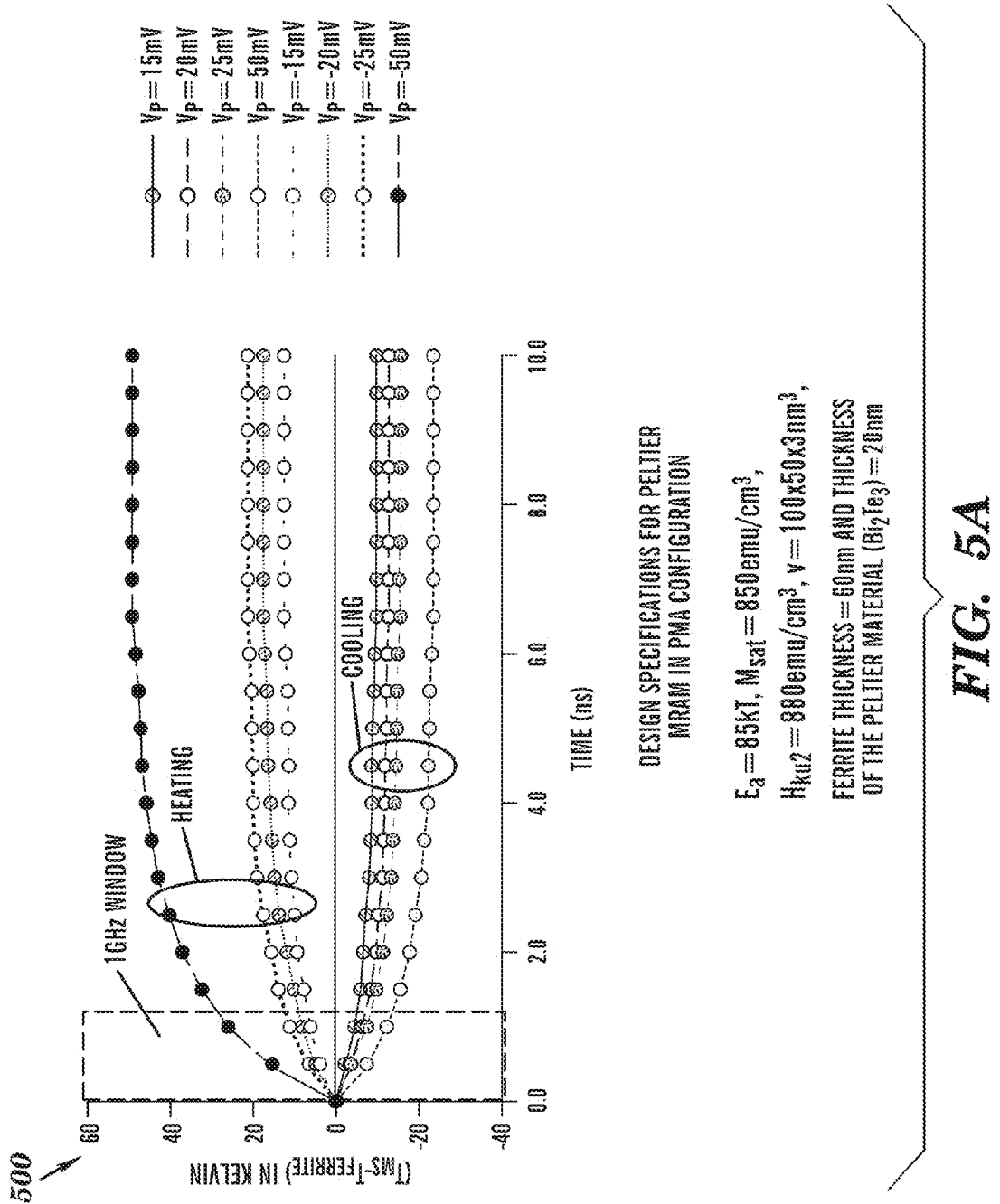
FIG. 5A illustrates a graph as an example of transient response for heating and cooling in a device according to an exemplary embodiment.

FIGS. 5A illustrates a graph 500 as an example of transient response of heating and cooling in Peltier MRAM (such as devices 100, 200, 300) under steady electrical current according to exemplary embodiments. FIG. 5A illustrates a uniform temperature increase (uniform step function) from heating or a uniform temperature decrease from cooling with zero (0) as a normalized starting point. In FIG. 5A, the y-axis is the difference in temperature ($\delta T=T_{MS}-T_{FERRITE}$, in Kelvin) between the metal spacer below the stack (the reference layer, tunnel barrier, and free layer) and the insulating magnet (which is the ferrite). The x-axis shows the time (in nanoseconds) for applying the heating or cooling in the Peltier MRAM device. Bipolar voltages are applied between the leads L1 and L2. A positive voltage ($V_P>0$) leads to positive $\delta T$, whereas, a negative voltage ($V_P<0$) makes $\delta T$ negative.

Figure 5B:
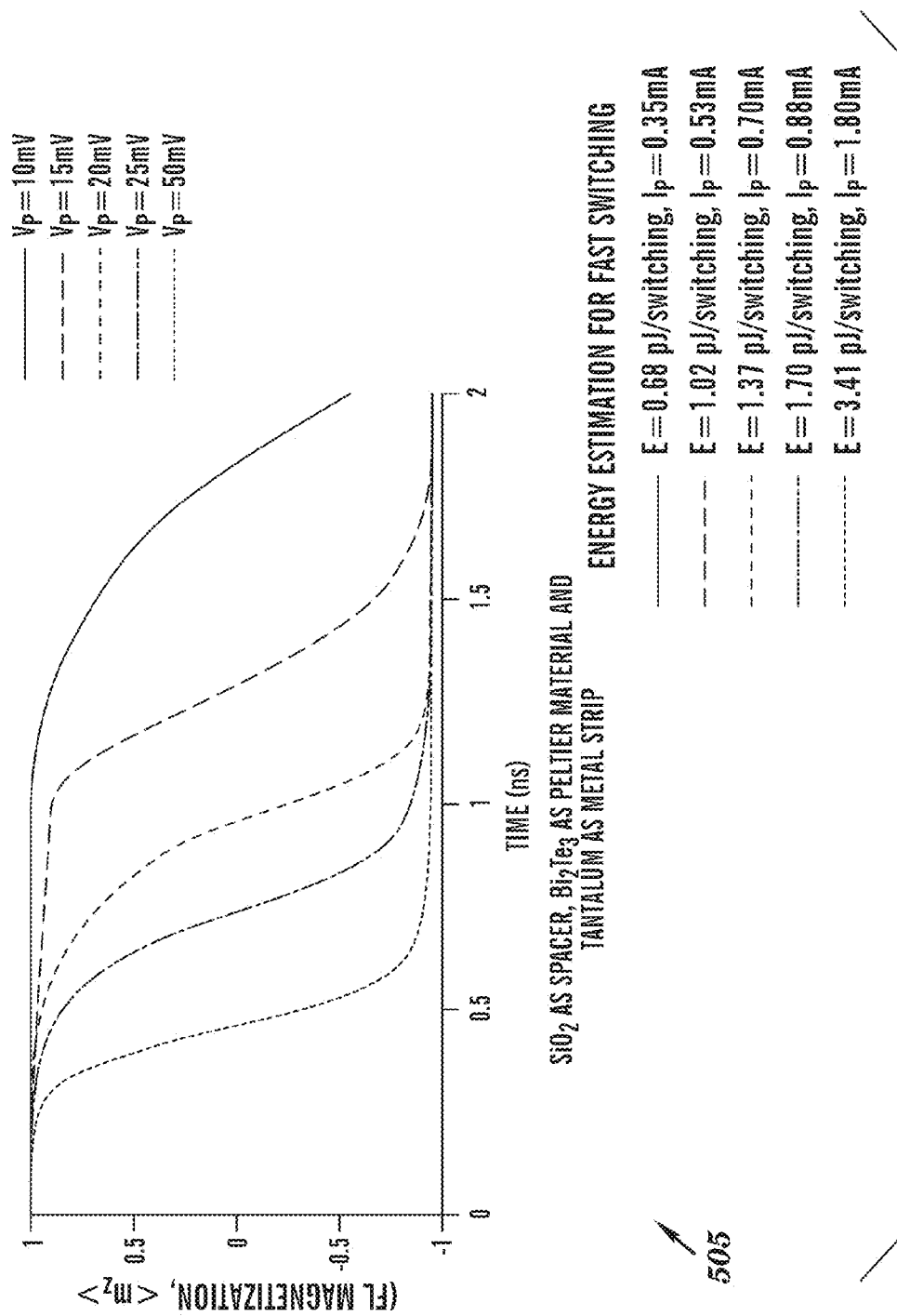
FIG. 5B illustrates a graph as an example of transient response for a device according to an exemplary embodiment.

FIG. 5B illustrates a graph 505 as an example of a transient response to heating in Peltier MRAM (such as devices 100, 200, 300) under steady electrical current according to exemplary embodiments. FIG. 5B illustrates an example of switching the free layer for one magnetization orientation such as right (or up) to a different magnetization orientation such as left (or down) when the Peltier material is heated. The y-axis represents switching from one magnetization to another. On the y-axis, 1 represents one magnetization orientation (e.g., to the right) of the free layer while −1 represents another magnetization of the free layer. The x-axis represents the switching time (in nanoseconds) for switching the free layer from one magnetization orientation to another for a given energy E and a given Peltier current (Ip) applied to the Peltier material. For example, for 50 mV applied across leads (e.g., such as leads L1 and L2 in FIGS. 1 and 3 or leads L1 and L4 in FIG. 2) of the Peltier material, for switching energy (E) is 3.41 pJ/switching, and for Peltier current Ip=1.80 mA, the free layer is switched in less than 1 ns.

Figure 6:
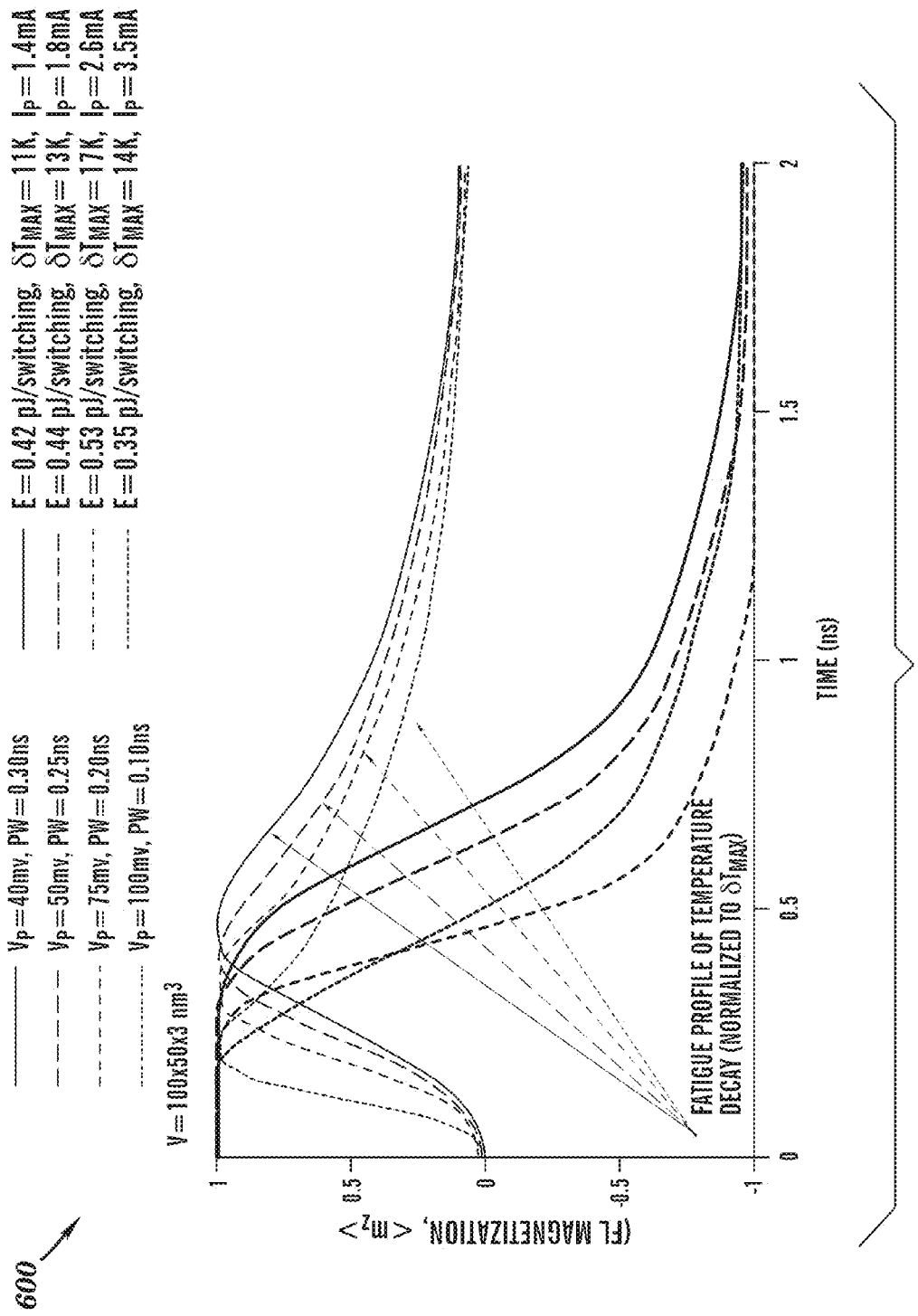
FIG. 6 illustrates a graph as an example of transient response for heating and cooling in a device under a short duration current pulse according to an exemplary embodiment.

FIG. 6 illustrates a graph 600 as an example of transient response of heating and cooling in Peltier MRAM (such as devices 100, 200, 300) under short duration Peltier current pulse according to exemplary embodiments. FIGS. 5A and 5B illustrated a steady Peltier current applied by, e.g., the voltage sources 116, 216, 316 to heat (negative current) and/or cool (positive current) their respective Peltier material. However, FIG. 6 uses a short duration (pulse) of Peltier current (Ip) applied by, e.g., the voltage sources 116, 216, 316 to heat (negative current) and/or cool (positive current) their respective Peltier material. The short duration Peltier current (Ip) pulse provides faster switching of the free layer as compared to a steady Peltier current, and the short duration Peltier current pulse provides a 50-60% energy savings over conventional spin torque MRAM devices.

The dashed lines in FIG. 6 represent the temperature decay profile at the metal-ferrite interface for various Gaussian electrical pulses of voltage amplitude $V_P$ and pulse-width PW. For example, the black dash line provides the temperature decay profile ($\delta T$) normalized to $\delta T_{MAX}=14K$ for a Gaussian electrical voltage pulse of amplitude 100 mv and PW=0.1 ns. The corresponding current that flows between the leads L1 and L2 is $I_P=3.5$ mA (also Gaussian in shape as the applied voltage $V_P$). The total energy dissipated in magnetization switching (parallel-antiparallel) is E=0.35pico-joule switching. The parallel to antiparallel switching response has been shown in black solid curves in FIG. 6.

Further, in accordance with exemplary embodiments, when the voltage sources 116, 216, 316 apply current pulses between a range of 1 mA-3.5 mA for a duration range of 0.1 ns-0.3 ns, the magnetization of the free layer 110, 210, 310 (in the devices 100, 200, 300) is configured to switch in 2 ns (e.g., less than 2 ns, approximately 2 ns, and/or a little above 2 ns).

In exemplary embodiments, the Peltier material may be niobium doped $SrTiO_3$. The lead L2 may comprise a conducting material with a high melting temperature, e.g., the lead L2 may include but is not limited to conducting material such as tungsten, molybdenum, TaN, Ta, TiN, and mixtures thereof.

Figure 7:
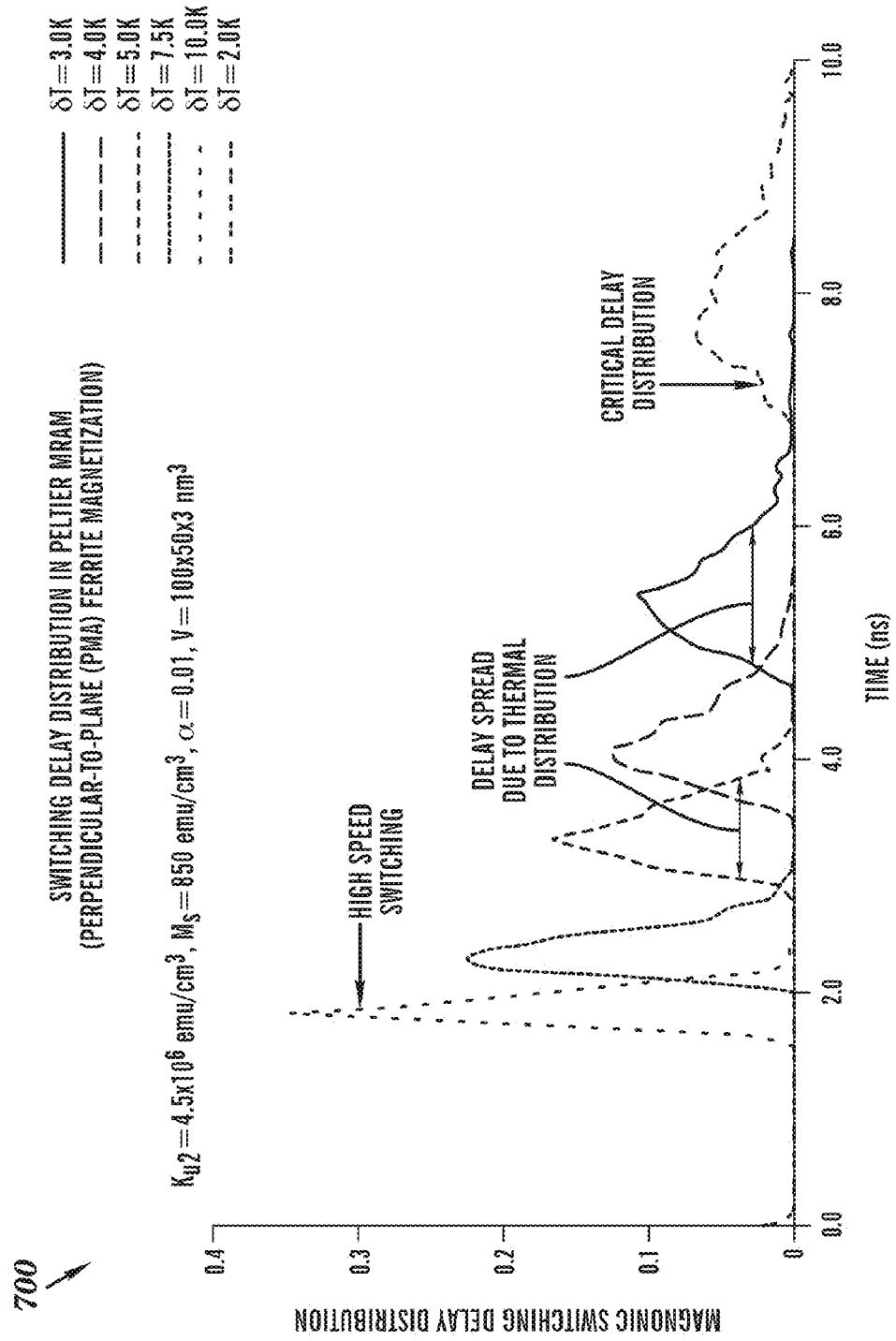
FIG. 7 illustrates a graph switching delay distribution of Peltier MRAM device according to an exemplary embodiment.

Now turning to FIG. 7, FIG. 7 illustrates a graph 700 for switching delay distribution in Peltier MRAM devices (such as devices 100, 200, 300) according to exemplary embodiments.

The graph 700 shows the probability distribution of switching delay in Peltier MRAM with perpendicular magnetic anisotropy (magnetic anisotropy of the free layer 110, 210, 310, the reference layer 114, 214, 314, and insulating magnet 104, 204, 304 is perpendicular to the plane). The MRAM design specifications are: perpendicular magnetic anisotropy ($K_{u2}$)=4.5×106 emu/cm$^3$; saturation magnetization ($M_s$)=850 emu/cm$^3$; gilbert damping constant ($\alpha$)=0.01; volume of the free layer (V)=100×50×3 nm$^3$.

A higher temperature gradient ($\delta T$) at the metal-ferrite interface (which is the metal spacer/insulating magnet interface 106, 206, 306) reduces the mean switching delay as illustrated in graph 700. However, for a given switching delay and failure probability, switching temperature gradient ($\delta T_C$) increases (considerably) due to stochastic thermal fluctuation of the free layer magnetization. This may make the switching in Peltier MRAM non-reproducible and stochastic which in turn reduces the parametric memory yield. The thermal incubation delay leads to the long-tail of the switching delay distributions as shown in FIG. 7. The lower the temperature difference ($\delta T$) is, the dominance of thermal incubation delay is more, which causes an elongated tail of the distribution. The delay spread is more for a lower $\delta T$ (=2 Kelvin) than a higher $\delta T$ (=10 Kelvin).

Figure 8:
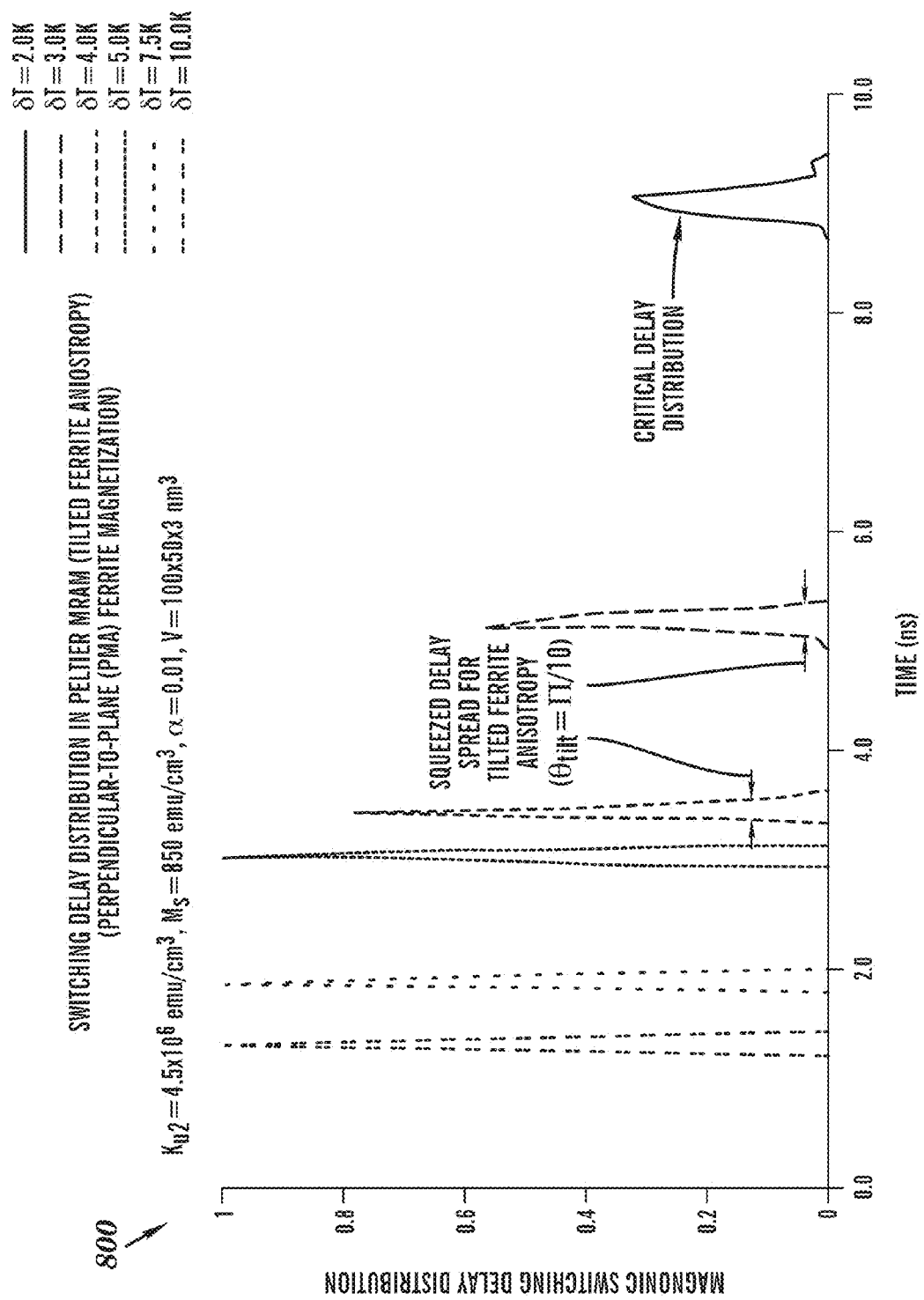
FIG. 8 illustrates a graph switching delay distribution of Peltier MRAM device with tilted anisotropy according to an exemplary embodiment.

FIG. 8 illustrates a graph 800 which the probability distribution in Peltier MRAM with perpendicular magnetic anisotropy (magnetic anisotropy of the free layer 110, 210, 310, the reference layer 114, 214, 314, and insulating magnet 104, 204, 304 is perpendicular to the plane) according to exemplary embodiments. However, in the case for FIG. 8, the switching delay distribution in Peltier MRAM (e.g., such as devices 100, 200, 300) is shown when tilting the insulating magnet (ferrite) magnetic anisotropy slightly, which reduces the switching delay spread (as compared to the graph 700) according to exemplary embodiments. In this case, the magnetization of the insulating magnet 104, 204, 304 is not completely perpendicular (up or down), but instead the magnetization is slightly tilted by an angle, e.g., $\theta_{tilt}=\pi/10$. It is contemplated that the magnetization of the insulating magnet may be tilted by less or more and the perpendicular magnetic anisotropy of the insulating magnet is not limited to being tilted by $\theta_{tilt}=\pi/10$.

Also, the free layer magnetic switching becomes reproducible for a given temperature gradient and the switching delay distribution gets squeezed (i.e. reduced in size on the x-axis). The design improves the parametric memory yield significantly. With collinear magnetic anisotropies ($\theta_{tilt}=0°$) between the free layer and the insulating magnet (ferrite), magnonic current induced magnetization switching is initiated by thermally induced initial angular precession of the free-layer moment around its easy-axis (which is perpendicular to the plane in our example case but not limited to the same). A faster switching with sufficiently low switching failure probability requires a sufficiently large $\delta T$ (>10K). However, with a marginal tilt of the insulating magnet anisotropy (e.g., $\theta_{tilt}$~pi/10 radian), the magnonic current induced magnetization reversal becomes essentially independent of the initial thermal fluctuation, thus making the free layer switching almost error-free.

Figure 9:
FIG. 9 illustrates a flow chart of forming an apparatus for bidirectional writing according to an exemplary embodiment.

FIG. 9 illustrates a flow chart 900 of a process for forming an apparatus for bidirectional writing of the free layer. Reference is made to the device 100 in FIG. 1.

Initially, a Peltier material (e.g., Peltier material 102) is formed on a first lead (e.g., metal lead L1) at block 902. A second lead (e.g., metal lead L2) is formed on the Peltier material 102 at block 904. At block 906, an insulating material (e.g., ferrite insulating material 104) is formed on the second lead. The insulating material 104 can have an in-plane magnetic anisotropy (e.g., left or right magnetization).

Further, a normal metal spacer (e.g., normal metal spacer 108) is formed on the insulating magnet 104 at block 908. The insulating magnet 104 is an insulator that does not conduct electricity. At block 910, a free layer (e.g., free layer 110) is formed on the normal metal spacer 108. A tunnel barrier (e.g., tunnel barrier 112) is formed on the free layer 110 at block 912. A reference layer 114 is formed on the tunnel barrier 112 at block 914. At block 916, a third lead (e.g., metal lead L3) is formed on the reference layer 114.

Figure 10:
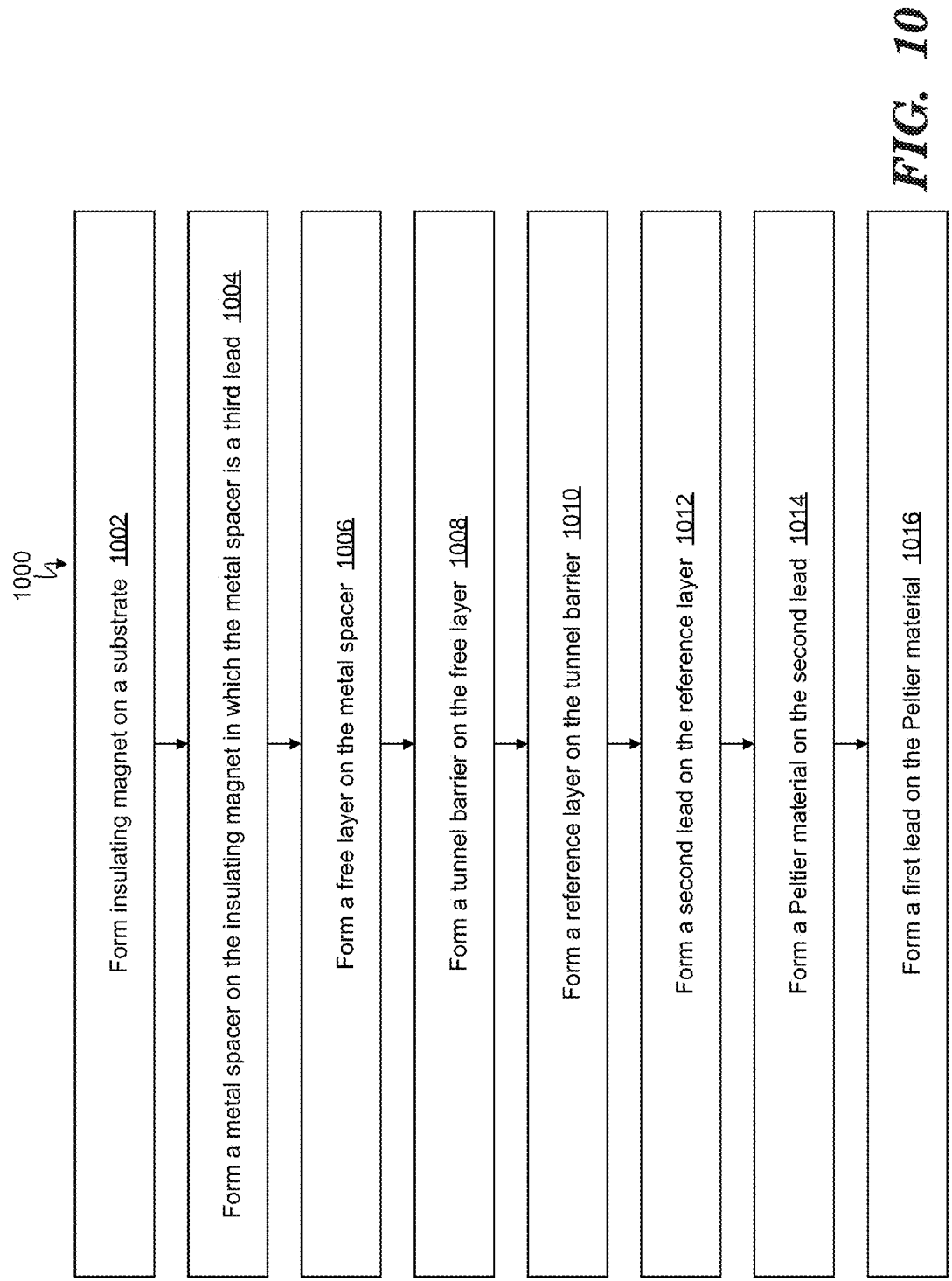
FIG. 10 illustrates a flow chart forming an apparatus for bidirectional writing according to an exemplary embodiment.

FIG. 10 illustrates a flow chart 1000 of a process for forming an apparatus for bidirectional writing of the free layer according to exemplary embodiments. Reference is made to device 300 in FIG. 3.

An insulating magnet (e.g., insulating magnet 304) is formed on a substrate (e.g., substrate 301) at block 1002. A normal metal spacer (e.g., metal spacer 308) is formed on the insulating magnet 304 at block 1004. The metal spacer 308 also is a third lead (e.g., metal lead L3). A free layer (e.g., free layer 310) is formed on the normal metal spacer 308 at block 1006.

Also, a tunnel barrier (e.g., tunnel barrier 312) is formed on the free layer 310 at block 1008. At block 1010, a reference layer (e.g., reference layer 314) is formed on the tunnel barrier 312. A second lead (e.g., metal lead L2) is formed on the reference layer 314 at block 1012. A Peltier material (e.g., Peltier material 302) is formed on the second lead at block 1014. At block 1016, a first lead (e.g., metal lead L1) is formed on the Peltier material 302.

Figure 11:
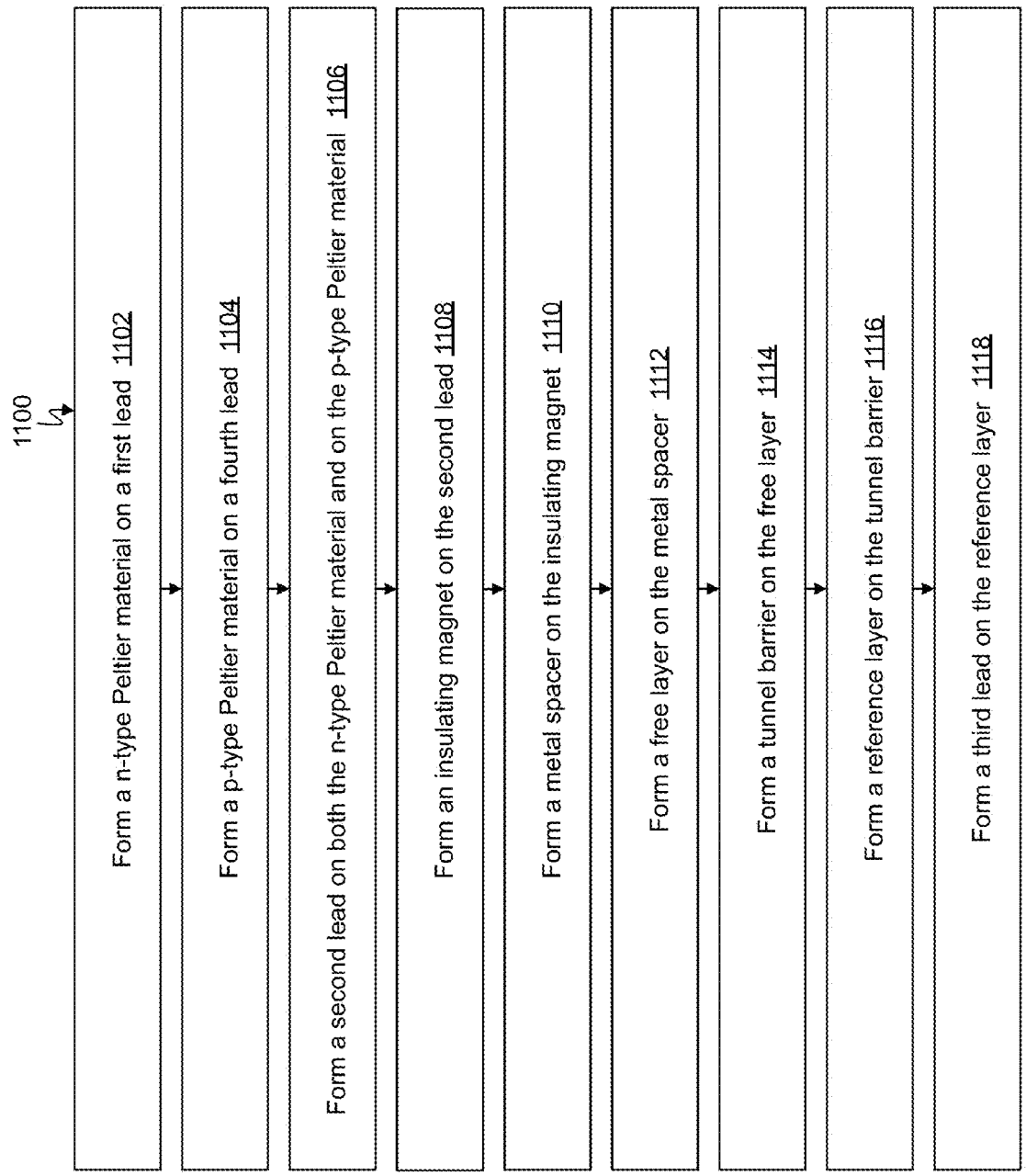
FIG. 11 illustrates a flow chart forming an apparatus for bidirectional writing according to an exemplary embodiment.

FIG. 11 illustrates a flow chart 1100 of a process for forming an apparatus for bidirectional writing of the free layer according to exemplary embodiments. Reference is made to device 200 in FIG. 2.

A n-type Peltier material (e.g., n-type Peltier material 201) is formed on a first lead (e.g., metal lead L1) at block 1102. The n-type Peltier material 201 is doped with dopants to create excess negative charges in the n-type Peltier material 201. At block 1104, a p-type Peltier material (e.g., p-type Peltier material 202) is formed on a fourth lead (e.g., metal lead L4). The p-type Peltier material 202 is doped with dopants to create excess positive charges in the p-type Peltier material 202.

Further, a second lead (e.g., metal lead L2) is formed on both the n-type Peltier material 201 and on the p-type Peltier material 202 at block 1106. An insulating magnet (e.g., insulating magnet 204) is formed on the second lead L2 at block 1108. At block 1110, a normal metal spacer (e.g., normal metal spacer 208) is formed on the insulating magnet 204. A free layer 210 is formed on the normal metal spacer 208 at block 1012. A tunnel barrier (e.g., tunnel barrier 212) is formed on the free layer 210 at block 1114, and a reference layer (e.g., reference layer 214) is formed on the tunnel barrier 212 at block 1116. At block 1118, a third lead (e.g., metal lead L3) is formed on the reference layer 214.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A magnetoresistive random access memory (MRAM) device, comprising:
    a magnetic stack, comprising a reference layer adjacent to a tunnel barrier, the tunnel barrier adjacent to a free layer, and the free layer adjacent to a metal spacer;
    an insulating magnet;
    a n-type Peltier material thermally coupled to the insulating magnet and the magnetic stack; and
    a p-type Peltier material thermally coupled to the insulating magnet and the magnetic stack;
    a first metal lead, a second metal lead, a third metal lead, and a fourth metal lead;
    wherein the n-type Peltier material is adjacent to the first metal lead and a part of the second metal lead is adjacent to the n-type Peltier material, the p-type Peltier material is adjacent to the fourth metal lead and a different part of the second metal lead is adjacent to the p-type Peltier material;
    wherein the second metal lead is formed on top of both the n-type Peltier material and the p-type Peltier material;
    wherein the second metal lead is a different material than both the n-type Peltier material and the p-type Peltier material;
    wherein the insulating magnet is adjacent to the second metal lead, the stack is adjacent to the insulating magnet, and the third metal lead is adjacent to the stack;
    wherein a left part of the insulating magnet and the n-type Peltier material together sandwich the part of the second metal lead that is adjacent to the n-type Peltier material;
    wherein a right part of the insulating magnet and the p-type Peltier material together sandwich the different part of the second metal lead;
    wherein positive current flows into the first metal lead and out through the fourth metal lead via the n-type Peltier material, the second metal lead, and the p-type Peltier material to cool an interface between the n-type Peltier material and the second metal lead and to cool an interface between the p-type Peltier material and the second metal lead;
    wherein positive current flows into the fourth metal lead and out through the first metal lead via the p-type Peltier material, the second metal lead, and the n-type Peltier material to heat an interface between the n-type Peltier material and the second metal lead and to heat an interface between the p-type Peltier material and the second metal lead;
    wherein cooling of the interface between the n-type Peltier material and the second metal lead and cooling of the interface between the p-type Peltier material and the second metal lead cause the insulating magnet to transfer a spin torque to rotate a magnetization of the free layer in a first direction, based on positive current flowing into the first metal lead and out through the fourth metal lead; and
    wherein heating of the interface between the n-type Peltier material and the second metal lead and heating of the interface between the p-type Peltier material and the second metal lead cause the insulating magnet to transfer the spin torque to rotate the magnetization of the free layer in a second direction, based on positive current flowing into the fourth metal lead and out through the first metal lead.

2. The device of claim 1, wherein an applied voltage with a first polarity across the first metal lead and the fourth metal lead connected to the n-type Peltier material and the p-type Peltier material respectively, causes the insulating magnet to transfer the spin torque to rotate the magnetization of the free layer in the first direction based on the first polarity of the voltage; and
    wherein the applied voltage with a second polarity across the first metal lead and the fourth metal lead connected to the n-type Peltier material and the p-type Peltier material respectively, causes the insulating magnet to transfer the spin torque to rotate the magnetization of the free layer in the second direction based on the second polarity of the voltage.

3. The device of claim 1, wherein:
    the magnetization of the free layer is out of plane;
    a magnetization of the insulating magnet is out of plane and has a tilt, the tilt for the magnetization of the insulating magnet corresponds to an anisotropy being tilted from a perpendicular direction for the insulating magnet; and
    the tilt for the magnetization of the insulating magnet decreases a switching delay for the spin torque to rotate the magnetization of the free layer.

4. The device of claim 2, wherein electrical current pulses applied via the first metal lead of the n-type Peltier material and the fourth metal lead of the p-type Peltier material cause cooling of an interface between the n-type Peltier material and the insulating material and cooling of an interface between the p-type Peltier material and the insulating material for the first polarity of the voltage; and
    wherein the electrical current pulses applied via the first metal lead of the n-type Peltier material and the fourth metal lead of the p-type Peltier material cause heating of the interface between the n-type Peltier material and the insulating material and heating of the interface between the p-type Peltier material and the insulating material for the second polarity of the voltage.

5. A method of forming a magnetoresistive random access memory (MRAM) device, the method comprising:
    forming an insulating magnet adjacent to a substrate;
    forming a metal spacer adjacent to the insulating magnet, the metal spacer being a third lead;
    forming a free layer adjacent to the metal spacer;
    forming a tunnel barrier adjacent to the free layer;
    forming a reference layer adjacent to the tunnel barrier;
    forming a second lead adjacent to the reference layer;
    forming a Peltier material adjacent to the second lead;
    forming a first lead adjacent to the Peltier material;
    wherein the Peltier material is formed on and disposed on the first lead;
    wherein the second lead is formed on and disposed on the Peltier material, the first lead and the second lead being adjacent to a same layer which is the Peltier material;

wherein the second lead is disposed on top of the Peltier material while the first lead is disposed on a bottom of the Peltier material opposing the second lead, such that the Peltier material is sandwiched in between the first and second leads;

wherein the second lead and the Peltier material are both sandwiched in between the insulating magnet and the first lead;

causing positive current to flow into the first lead, through the Peltier material formed on the first lead, and out through the second lead formed on top of the Peltier material to cool an interface between the Peltier material and the insulating magnet;

causing the positive current to flow into the second lead formed on the Peltier material, through the Peltier material formed on the first lead, and out through the first lead to heat the interface between the Peltier material and the insulating magnet;

cooling the interface between the Peltier material and the insulating magnet to cause the insulating magnet to transfer a spin torque to rotate a magnetization of the free layer in a first direction, based on the positive current flowing into the first lead and out through the second lead; and heating the interface between the Peltier material and the insulating magnet to cause the insulating magnet to transfer the spin torque to rotate the magnetization of the free layer in a second direction, based on the positive current flowing into the second lead and out through the first lead.

6. The method of claim 5, wherein:

the magnetization of the free layer is out of plane;

a magnetization of the insulating magnet is out of plane and has a tilt, the tilt for the magnetization of the insulating magnet corresponds to an anisotropy being tilted from a perpendicular direction for the insulating magnet; and the tilt for the magnetization of the insulating magnet decreases a switching delay for the spin torque to rotate the magnetization of the free layer.

7. A method of forming a magnetoresistive random access memory (MRAM) device, the method comprising:

forming a n-type Peltier material adjacent to a first metal lead;

forming a p-type Peltier material adjacent to a fourth metal lead;

forming a second metal lead adjacent to both the n-type Peltier material and the p-type Peltier material;

wherein the second metal lead is formed on top of both the n-type Peltier material and the p-type Peltier material;

wherein the second metal lead is a different material than both the n-type Peltier material and the p-type Peltier material;

forming an insulating magnet adjacent to the second metal lead;

forming a metal spacer adjacent to the insulating magnet;

forming a free layer adjacent to the metal spacer;

forming a tunnel barrier adjacent to the free layer;

forming a reference layer adjacent to the tunnel barrier; and forming a third metal lead adjacent to the reference layer;

wherein a left part of the insulating magnet and the n-type Peltier material together sandwich the part of the second metal lead that is adjacent to the n-type Peltier material;

wherein a right part of the insulating magnet and the p-type Peltier material together sandwich the different part of the second metal lead;

wherein positive current flows into the first metal lead and out through the fourth metal lead via the n-type Peltier material, the second metal lead, and the p-type Peltier material to cool an interface between the n-type Peltier material and the second metal lead and to cool an interface between the p-type Peltier material and the second metal lead; and wherein positive current flows into the fourth metal lead and out through the first metal lead via the p-type Peltier material, the second metal lead, and the n-type Peltier material to heat an interface between the n-type Peltier material and the second metal lead and to heat an interface between the p-type Peltier material and the second metal lead;

wherein an applied voltage with a positive polarity across the first metal lead relative to the fourth metal lead connected to the n-type Peltier material and the p-type Peltier material respectively, causes the insulating magnet to transfer the spin torque to rotate the magnetization of the free layer in the first direction, based on positive current flowing into the first metal lead and out through the fourth metal lead; and wherein the applied voltage with a negative polarity across the first metal lead relative to the fourth metal lead connected to the n-type Peltier material and the p-type Peltier material respectively, causes the insulating magnet to transfer the spin torque to rotate the magnetization of the free layer in the second direction, based on positive current flowing into the fourth metal lead and out through the first metal lead.

8. The method of claim 7, wherein:

the magnetization of the free layer is out of plane;

a magnetization of the insulating magnet is out of plane and has a tilt, the tilt for the magnetization of the insulating magnet corresponds to an anisotropy being tilted from a perpendicular direction for the insulating magnet; and the tilt for the magnetization of the insulating magnet decreases a switching delay for the spin torque to rotate the magnetization of the free layer.

* * * * *